United States Patent
Cao et al.

(10) Patent No.: US 9,263,321 B2
(45) Date of Patent: Feb. 16, 2016

(54) SEMICONDUCTOR DEVICE AND MANUFACTURING METHOD THEREOF

(71) Applicant: Semiconductor Manufacturing International (Shanghai) Corporation, Shanghai (CN)

(72) Inventors: Paul Cao, Shanghai (CN); Shanon Pu, Shanghai (CN); Roy Wang, Shanghai (CN); Enty Cheng, Shanghai (CN); Lily Song, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 15 days.

(21) Appl. No.: 13/970,333

(22) Filed: Aug. 19, 2013

(65) Prior Publication Data

US 2014/0167122 A1    Jun. 19, 2014

(30) Foreign Application Priority Data

Dec. 17, 2012    (CN) .......................... 2012 1 0545982

(51) Int. Cl.
    *H01L 21/768*    (2006.01)
    *H01L 23/485*    (2006.01)
    *H01L 29/66*    (2006.01)

(52) U.S. Cl.
    CPC ........ *H01L 21/768* (2013.01); *H01L 21/76889* (2013.01); *H01L 21/76895* (2013.01); *H01L 21/76897* (2013.01); *H01L 23/485* (2013.01); *H01L 29/665* (2013.01); *H01L 29/66545* (2013.01); *H01L 2924/0002* (2013.01)

(58) Field of Classification Search
CPC ... H01L 21/76; H01L 29/6659; H01L 21/768; H01L 2924/0002; H01L 23/485; H01L 21/76895; H01L 21/76897; H01L 21/76889; H01L 29/665; H01L 29/66545; H01L 2924/002
USPC ......................................................... 257/288
See application file for complete search history.

(56) References Cited

U.S. PATENT DOCUMENTS

| | | | | |
|---|---|---|---|---|
| 4,822,749 | A * | 4/1989 | Flanner et al. ................ | 438/622 |
| 5,915,183 | A * | 6/1999 | Gambino et al. ............. | 438/300 |
| 5,955,770 | A * | 9/1999 | Chan et al. .................... | 257/408 |
| 6,160,296 | A * | 12/2000 | Violette et al. ................ | 257/377 |
| 2001/0045650 | A1 * | 11/2001 | Trivedi .......................... | 257/750 |
| 2002/0047205 | A1 * | 4/2002 | Trivedi et al. ................. | 257/757 |
| 2007/0194387 | A1 * | 8/2007 | Dyer et al. .................... | 257/369 |
| 2008/0105862 | A1 * | 5/2008 | Lung et al. ....................... | 257/4 |
| 2009/0090935 | A1 * | 4/2009 | Wang et al. ................... | 257/190 |
| 2010/0001354 | A1 * | 1/2010 | Chiu .............................. | 257/413 |
| 2011/0260262 | A1 * | 10/2011 | Yin et al. ....................... | 257/390 |

* cited by examiner

*Primary Examiner* — Yu Chen
*Assistant Examiner* — Nilufa Rahim
(74) *Attorney, Agent, or Firm* — Innovation Counsel LLP

(57) ABSTRACT

A semiconductor device and method of manufacturing the semiconductor device are disclosed. The semiconductor device includes: a substrate including an active region and at least one groove isolation region formed on the substrate, wherein the at least one groove isolation region is formed adjoining the active region, a gate structure formed on a first portion of the active region, and at least one local interconnection layer formed on a portion of the substrate, wherein the at least one local interconnection layer is located on a side of the gate structure, and covers at least a second portion of the active region and a portion of the groove isolation region adjoining the active region.

13 Claims, 7 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201210545982.3 filed on Dec. 17, 2012 and entitled "Semiconductor Device and Manufacturing Method thereof", which is incorporated herein by reference in its entirety.

FIELD

The present disclosure relates to the field of semiconductor technology, and more particularly to a semiconductor device and method of manufacturing the same.

BACKGROUND

Advancements in semiconductor technology have led to miniaturized semiconductor devices. However, further miniaturization of semiconductor devices poses scaling challenges, particularly in the fabrication of the semiconductor devices. For example, the miniaturization of semiconductor devices may be limited by process and design rules.

The scaling challenges will be briefly described with reference to FIG. 1, which shows a cross-section view of a conventional semiconductor device in the prior art.

As shown in FIG. 1, the conventional semiconductor device may include an active region 103 and one or more isolation regions 105/107 formed in a substrate 101. A gate structure may be formed on a portion of the active region 103. The gate structure may include a gate insulation layer 109, a gate 111, and one or more spacers 113.

As further shown in FIG. 1, silicide layers 121 and 123 may be formed on exposed surfaces of the active region 103. A silicide layer 125 may also be formed on a top surface of the gate 111.

An insulation layer 115 may be formed over the substrate 101, and contact holes may be formed through the insulation layer 115 to the silicided active region 103 and gate 111. Contacts 117 may then be formed in the contact holes, so as to enable electrical connectivity to the silicided active region 103 and gate 111.

In semiconductor device scaling, it is desirable to increase device density by increasing the number of devices within a given area. This may be achieved, for example, by reducing the distances X1 and X2 between the respective groove isolation regions 105/107 and edges of the gate 111 (shown in FIG. 1).

Before the distances X1 and X2 may be reduced, the following dimensions need to be first taken into consideration: (1) a lateral size of each spacer 113, (2) a lateral size of each contact hole (or contact 117), and (3) a distance from each contact hole (or contact 117) to the respective groove isolation regions 105/107. The above dimensions determine the minimum "coverage" of the contacts 117 over the active region 103, as required by contact-to-active region design rules.

As a result, reductions in the distances X1 and X2 may be constrained by process and design rules. For example, due to restrictions imposed by gate current leakage, etc., the lateral size of the spacers 113 may not be reduced below a minimum size. Additionally, the process and design rule limitations may require certain minimum dimensions for the size of the contact holes (or contacts 117) and/or the distances from the contact holes (or contacts 117) to the respective groove isolation regions 105/107.

In some instances, although the dimensions X1 and X2 may be reduced using advanced reticle technologies (in lithography and etching), these next-generation semiconductor process technologies may be costly, and therefore may not provide a cost-effective solution in further miniaturization of semiconductor devices.

SUMMARY

The present disclosure is directed to address at least one of the above problems in the prior art.

According to some embodiments of the inventive concept, a method of manufacturing a semiconductor device is provided. The method includes: forming, on a substrate, an active region and at least one groove isolation region adjoining the active region, forming a gate structure on a first portion of the active region, forming at least one local interconnection layer on a portion of the substrate, wherein the local interconnection layer is located on a side of the gate structure, and covers at least a second portion of the active region and a portion of the groove isolation region adjoining the active region.

In some embodiments, forming the gate structure on the first portion of the active region may include forming a gate insulation layer on the first portion of the active region, forming a gate on the gate insulation layer, forming a hard mask layer on a top surface of the gate, and forming a spacer on at least side surfaces of the gate and the hard mask layer.

In some embodiments, forming the at least one local interconnection layer on the portion of the substrate may include forming a local interconnection material layer conformally over the groove isolation region, the active region, and the gate structure, forming a patterned hard mask on the local interconnection material layer, and etching the local interconnection material layer using the patterned hard mask as an etch mask, so as to form the at least one local interconnection layer.

In some embodiments, the at least one local interconnection layer may include polysilicon or metal.

In some embodiments, the at least one local interconnection layer may have a thickness ranging from about 10 Å to about 50 Å.

In some embodiments, a portion of the at least one local interconnection layer may be formed on a surface of the spacer.

In some embodiments, the method may further include forming a contact on a portion of the at least one local interconnection layer.

In some embodiments, the at least one local interconnection layer may include polysilicon, and the method may further include forming a silicide layer on at least a portion of the at least one local interconnection layer, and forming a contact on a portion of the silicide layer.

According to some other embodiments of the inventive concept, a semiconductor device is provided. The device includes: a substrate including an active region and at least one groove isolation region formed on the substrate, wherein the at least one groove isolation region is formed adjoining the active region, a gate structure formed on a first portion of the active region, and at least one local interconnection layer formed on a portion of the substrate, wherein the at least one local interconnection layer is located on a side of the gate structure, and covers at least a second portion of the active region and a portion of the groove isolation region adjoining the active region.

In some embodiments, the gate structure may include a gate insulation layer formed on the first portion of the active region, a gate formed on the gate insulation layer, and a spacer formed on at least a side surface of the gate.

In some embodiments, the gate structure may include a gate insulation layer formed on the first portion of the active region, a gate formed on the gate insulation layer, a hard mask layer formed on a top surface of the gate, and a spacer formed on at least side surfaces of the gate and the hard mask layer.

In some embodiments, the at least one local interconnection layer may include polysilicon or metal.

In some embodiments, the at least one local interconnection layer may have a thickness ranging from about 10 Å to about 50 Å.

In some embodiments, a portion of the at least one local interconnection layer may be formed on a surface of the spacer.

In some embodiments, the semiconductor device may further include a contact formed on a portion of the at least one local interconnection layer.

In some embodiments, the at least one local interconnection layer may include polysilicon, and the semiconductor device may further include a silicide layer formed on at least a portion of the at least one local interconnection layer, and a contact formed on a portion of the silicide layer.

Further features of the inventive concept will be apparent from the following detailed description of the various embodiments with reference to the accompanying drawings.

BRIEF DESCRIPTION OF DRAWINGS

The accompanying drawings, which are incorporated herein and constitute a part of the specification, illustrate different embodiments of the inventive concept and, together with the description, serve to more clearly describe the inventive concept.

Figure 1:
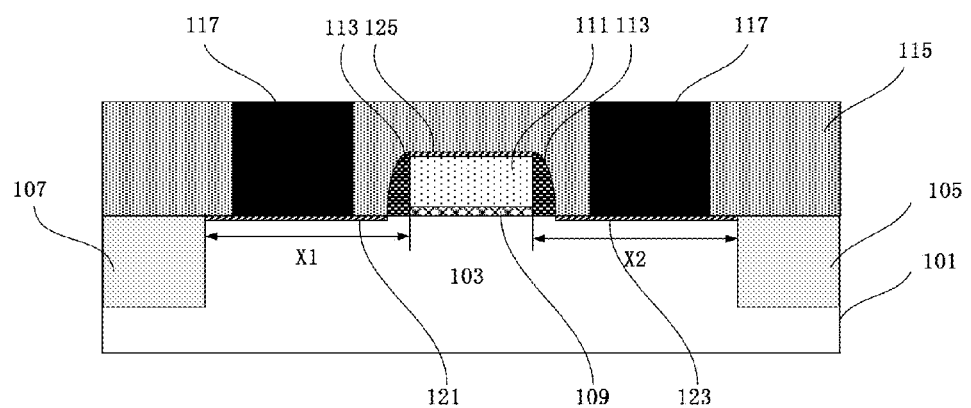
FIG. 1 is a cross-section view of a semiconductor device.

It is noted that the drawings are merely illustrative in nature, and that the parts shown in the drawings may not be drawn to scale.

DESCRIPTION OF EMBODIMENTS

Different embodiments of the inventive concept will herein be described in conjunction with the accompanying drawings. It is noted that the scope of the inventive concept is not limited by the relative arrangements of the elements and steps, expressions, numbers, and values in the embodiments, unless otherwise stated.

The following description of the different embodiments is merely illustrative, and is not intended to limit the scope, application, or use of the inventive concept. Technologies, methods, and components as known by one of ordinary skill in the art, although omitted in some instances, are intended to be part of the specification where appropriate.

In the embodiments illustrated and described herein, any specific value pertaining to a part should be interpreted as illustrative and non-limiting. For example, parts in other embodiments may have different values.

It is noted that like references or numbers are used to denote similar elements in the figures, and that after an element has been described with reference to a figure, a detailed description of the same element may be omitted in the description of subsequent drawings.

In the present disclosure, the term "semiconductor device" refers to a device having one or more semiconductor materials. The device may include a manufactured semiconductor device product and/or an intermediate semiconductor device product formed during a manufacturing or machining process.

Below, a semiconductor device and method of manufacturing the semiconductor device according to an embodiment of the inventive concept will be described with reference to FIGS. 2 to 10 and FIG. 13. FIGS. 2 to 10 are cross-section views of the semiconductor device at different stages of fabrication corresponding to the steps in the flowchart of FIG. 13. Those skilled in the art would appreciate that the steps in the flowchart of FIG. 13 can be implemented in various ways.

Figure 2:
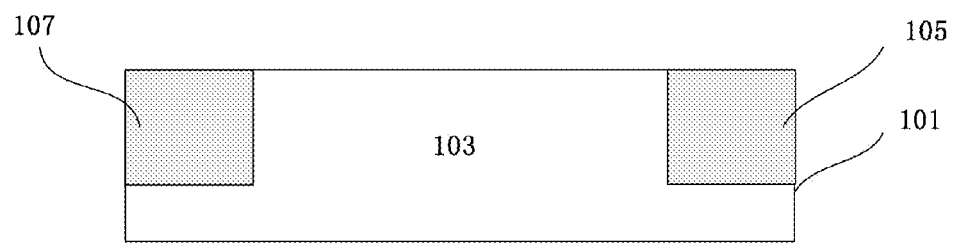
FIGS. 2 to 7, FIGS. 8A and 8B, and FIGS. 9 and 10 are cross-section views of a semiconductor device at different stages of fabrication according to some embodiments of the inventive concept.
Figure 13:
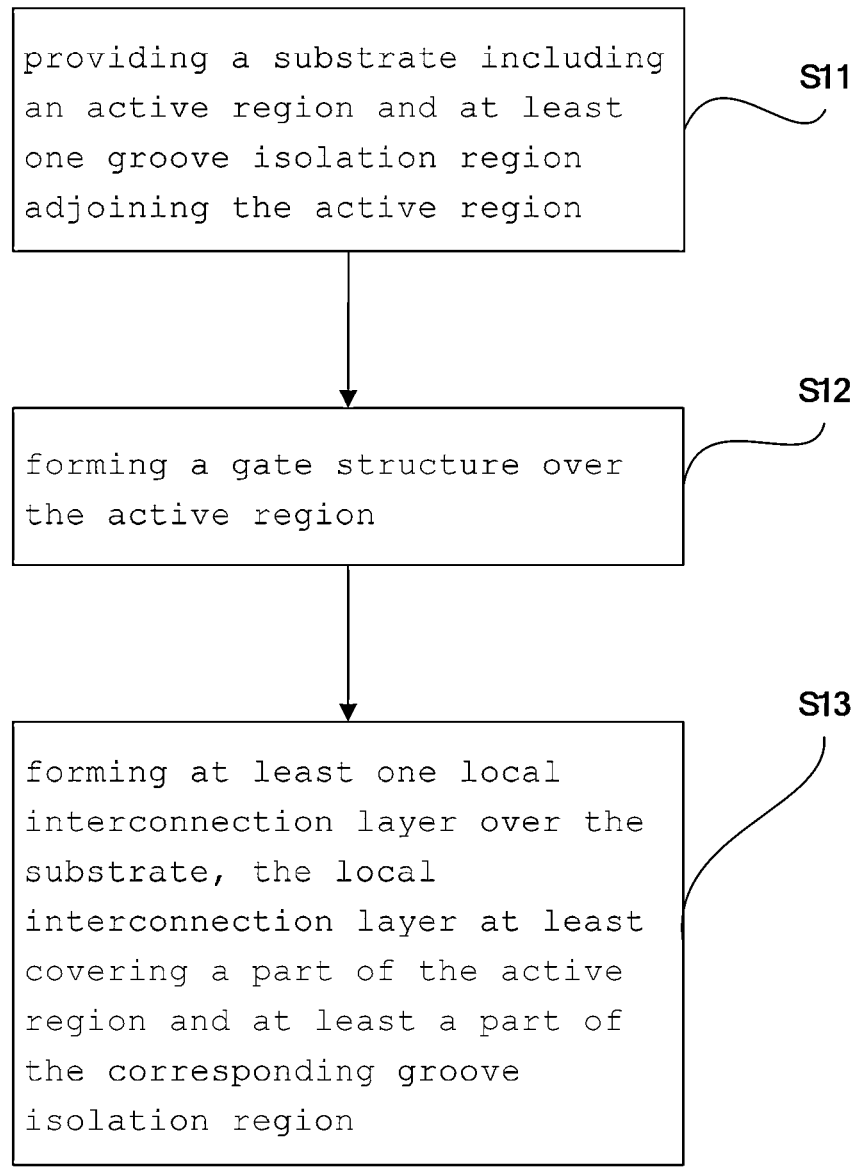
FIG. 13 is a flowchart of a method of manufacturing a semiconductor device according to an embodiment of the inventive concept.

With reference to step S11 of FIG. 13, a substrate 101 is provided. As shown in FIG. 2, the substrate 101 includes an active region 103 and at least one groove isolation region (e.g., groove isolation regions 105/107) formed on the substrate 101. The groove isolation regions 105/107 may be formed adjoining the active region 103. The groove isolation regions 105/107 may include, for example, an entire groove isolation region, or part of an entire groove isolation region.

In some embodiments, the top surfaces of the groove isolation regions 105/107 and active region 103 may share a common surface, as a result of the substrate 101 undergoing a surface planarization process (such as Chemical Mechanical Polishing (CMP)).

Next, in step S12 of FIG. 13, a gate structure is formed on a first portion of the active region 103.

Figure 3:
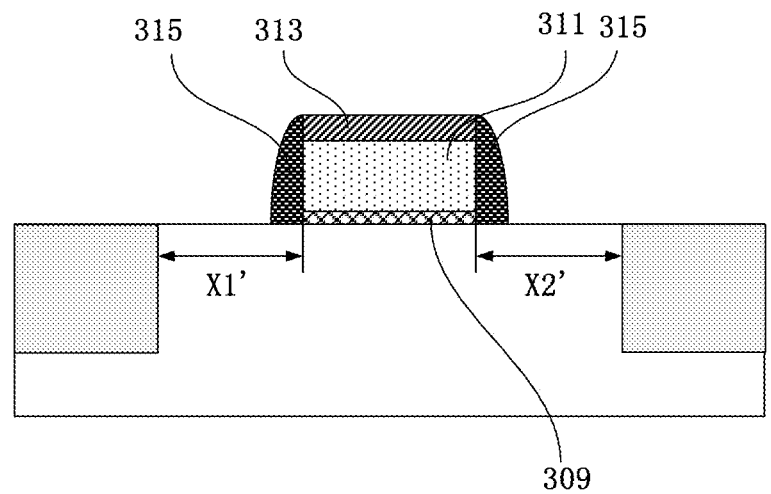

In some embodiments, the gate structure includes a gate insulation layer 309 formed on the first portion of the active region 103, a gate 311 formed on the gate insulation layer 309, and a hard mask layer 313 formed on a top surface of the gate 311 (See, e.g., FIG. 3). To form the gate structure, different material layers may be deposited on the substrate 101 and etched using a patterned mask. For example, layers of gate insulation material, gate material, and hard mask material may be sequentially deposited on the substrate 101 and etched using a patterned mask (e.g., formed using photolithography), so as to form the gate insulation layers 309, gate 311, and hard mask layer 313. As shown in FIG. 3, spacers 315 may be formed on side surfaces of the gate 311, hard mask layer 313, and gate insulation layer 309.

In some embodiments, the gate 311 may be formed of polysilicon. In some embodiments, the hard mask layer 313 may be formed of oxide, nitride, oxynitride, or the like, such as silicon oxide, silicon nitride, or silicon oxynitride.

As further shown in FIG. 3, a distance X1' denotes a distance between an edge of the isolation region 107 to a left side surface of the gate structure, and a distance X2' denotes a distance between an edge of the isolation region 105 to a right side surface of the gate structure. As described later in the specification, the distances X1' and X2' in a semiconductor device according to embodiments of the inventive concept (e.g., FIG. 10) may be less than the respective distances X1 and X2 in a conventional semiconductor device in the prior art (e.g., FIG. 1).

In some embodiments, a source region and a drain region may be formed in the active region 103, by injecting dopant into the active region 103 (e.g., in a self-alignment manner) after formation of the gate structure.

Next, with reference to step S13 of FIG. 13, at least one local interconnection layer (e.g., local interconnection layers 801 shown in FIG. 8B) may be formed on a portion(s) of the substrate.

Figure 7:
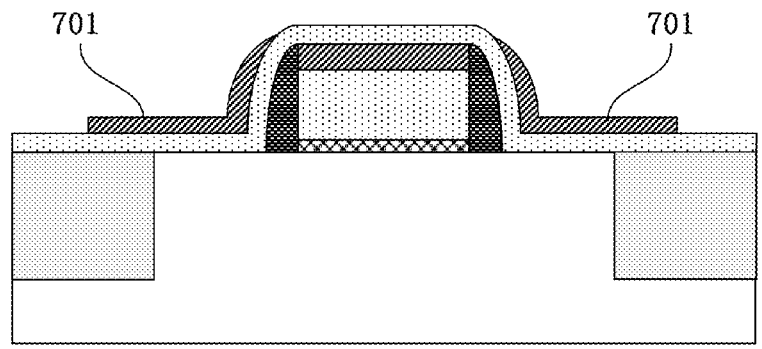
Figure 8A:
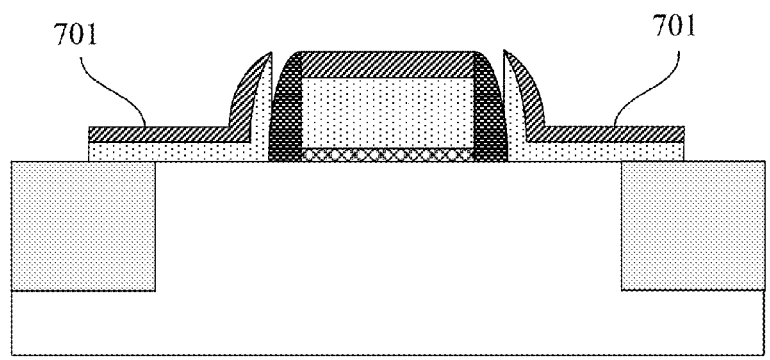
Figure 8B:
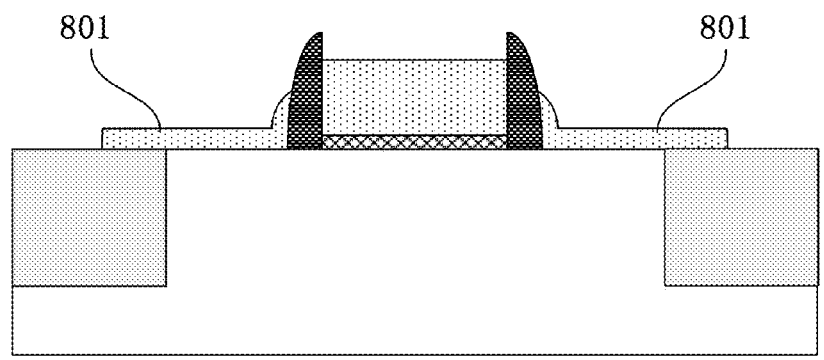

The formation of the local interconnection layers 801 in FIG. 8B is next described with reference to FIGS. 4 to 8B.

Figure 4:
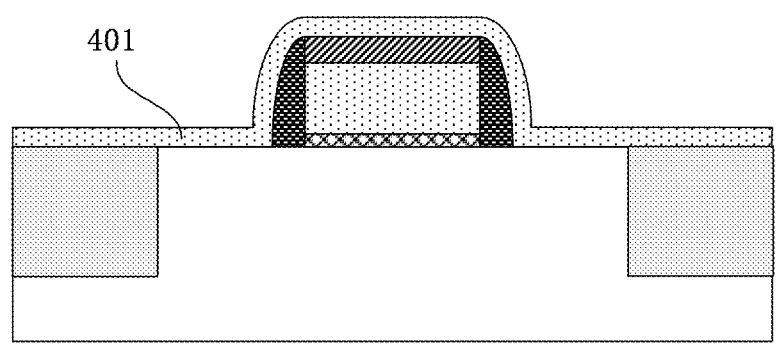

First, as shown in FIG. 4, a local interconnection material layer 401 is formed conformally over the structure of FIG. 3, so as to cover the groove isolation regions 105/107, active region 103, and gate structure. The local interconnection material layer 401 may be formed using known deposition methods such as CVD (Chemical Vapor Deposition) or sputtering.

In some embodiments, the local interconnection material layer 401 may include polysilicon, a metal (such as aluminium (Al)), or any other conductive material.

In some embodiments, if the local interconnection material layer 401 includes polysilicon, the polysilicon may be doped either through an additional process step or in-situ during deposition of the polysilicon, so as to reduce (contact) resistance of the polysilicon.

Figure 5:
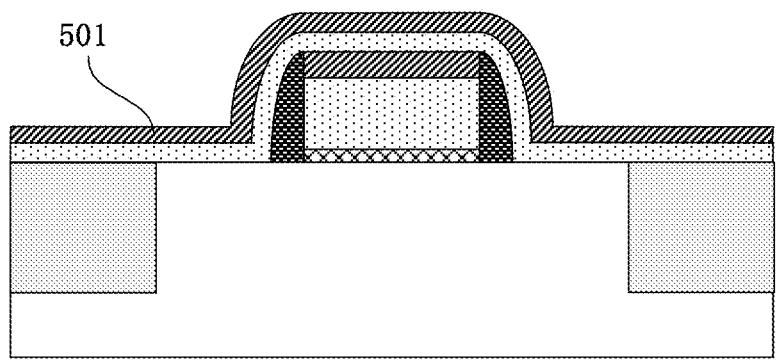

Next, as shown in FIG. 5, a hard mask layer 501 is formed on the local interconnection material layer 401. In some embodiments, the hard mask layer 501 may be formed of oxide, nitride, oxynitride, or the like, such as silicon oxide, silicon nitride, or silicon oxynitride. In some embodiments, the hard mask layer 501 may be formed of the same material as the hard mask layer 313.

Figure 6:
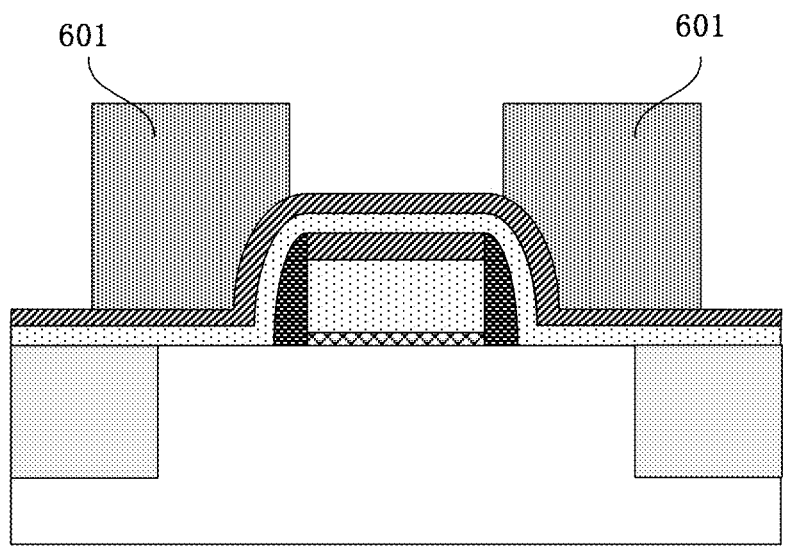

Next, as shown in FIG. 6, masks 601 are formed on the hard mask layer 501, with the masks 601 having a desired pattern. The desired pattern may be defined, for example, using photolithography. The masks 601 may include photo-masks, and may be formed of photoresists or other similar masking materials. As further shown in FIG. 6, a side edge of each mask 601 may be located directly above a side surface of each spacer 313.

Next, as shown in FIG. 7, the hard mask layer 501 is etched using masks 601 as a first etch mask, so as to form patterned hard masks 701. It is noted that the shapes and patterns illustrated in the drawings are merely exemplary, and those skilled in the art would appreciate that various profiles may be formed using different etching methods (such as wet etching and/or dry etching) and under different etching conditions.

Next, as shown in FIG. 8A, the local interconnection material layer 401 is etched using the patterned hard masks 701 as a second etch mask, so as to form local interconnection layers 801. The local interconnection material layer 401 may be etched using known etching methods such as dry etching or wet etching. As further shown in FIG. 8A, the etching of the local interconnection material layer 401 exposes the hard mask layer 313 formed on the top surface of the gate 311.

Next, as shown in FIG. 8B, the hard mask layer 313 and the patterned hard masks 701 are removed, for example, using known etching methods such as dry etching or wet etching. In some embodiments, if the patterned hard masks 701 (or hard mask layer 501) are formed of a same material as the hard mask layer 313, both the patterned hard masks 701 and the hard mask layer 313 may be removed using a same etchant or etching process.

In some embodiments, a controlled wet etch may be performed after dry etching of the local interconnection material layer 401. The controlled wet etch can remove unwanted residual local interconnection material, and can modify the structure of the semiconductor device to the profile shown in FIG. 8B.

As previously described, the profiles shown in the drawings are merely illustrative and non-limiting. Those skilled in the art would appreciate that different etching methods and etching conditions may result in different profiles, and that the scope of the inventive concept encompasses the different profiles.

In some embodiments, the local interconnection layers 801 may have a thickness ranging from about 10 Å to about 50 Å.

As shown in FIGS. 8A and 8B, the local interconnection layers 801 may be located on both sides of the gate structure, and cover a second portion of the active region 103 and portion(s) of the groove isolation regions 105/107 adjoining the active region 103.

Although FIGS. 8A and 8B show the local interconnection layers 801 located on both sides of the gate structure, the embodiments shown are merely illustrative and non-limiting. For example, in other embodiments, the local interconnection layer (e.g., local interconnection layer 801) may be located on only one side of the gate structure. In some other embodiments, the local interconnection layer (e.g., local interconnection layer 801) may be formed covering portions of a source region, drain region, or source and drain regions.

Figure 9:
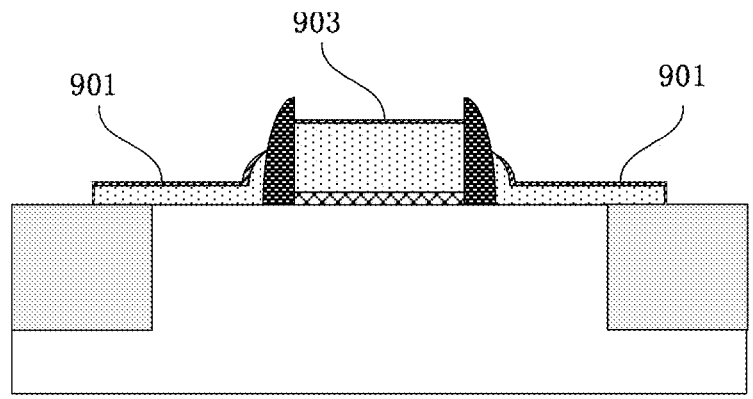

In some embodiments, silicide layers 901 and 903 may be formed on surfaces of the local interconnection layers 801 and gate 311 (as shown in FIG. 9), so as to reduce contact resistance. For example, the silicide layers 901 may reduce the contact resistance between the local interconnection layers 801 and contacts (e.g., contacts 117 shown in FIG. 10) formed on the local interconnection layers 801.

Figure 10:
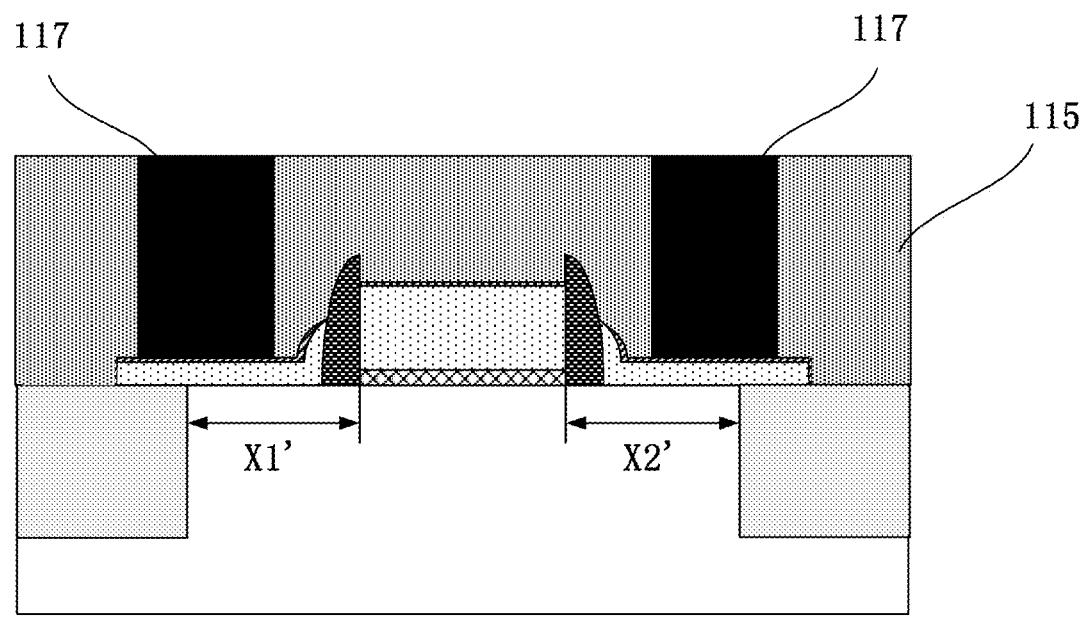

Next, referring to FIG. 10, an insulation layer 115 is deposited over the structure of FIG. 9, so as to cover the gate structure, local interconnection layers 801, and silicide layers 901/903 (if present). The insulation layer 115 may be formed of, for example, TEOS or any other insulating material.

As further shown in FIG. 10, contact holes are formed at designated locations in the insulation layer 115, with the contact holes extending through to the top surfaces of the local interconnection layers 801 (or silicide layers 901, if present). Contacts 117 are then formed in the contact holes, with the bottom surfaces of the contacts 117 in contact with the top surfaces of the local interconnection layers 801 (or silicide layers 901, if present). The insulation layer 115, contact holes, and contacts 117 may be formed using materials, processes, and/or steps known in the art.

Figure 11:
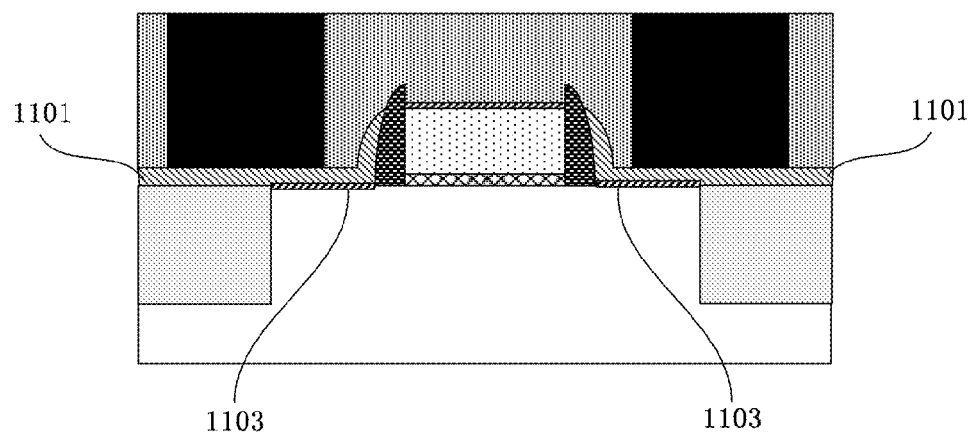
FIGS. 11 and 12 are cross-section views of a semiconductor device according to some other embodiments of the inventive concept.

FIG. 11 is a cross-section view of a semiconductor device according to another embodiment of the inventive concept. As shown in FIG. 11, the semiconductor device includes local interconnection layers 1101. The local interconnection layers 1101 may be formed of a metal (such as Al). In some embodiments, silicide layers 1103 may be formed on portions of the active region (e.g., active region 103) that are in contact with the local interconnection layers 1101, so as to reduce contact resistance. Additionally, the silicide layers 1103 may prevent metal (in the local interconnection layers 1101) from diffusing into the substrate (e.g., a substrate 101 formed of silicon).

Figure 12:
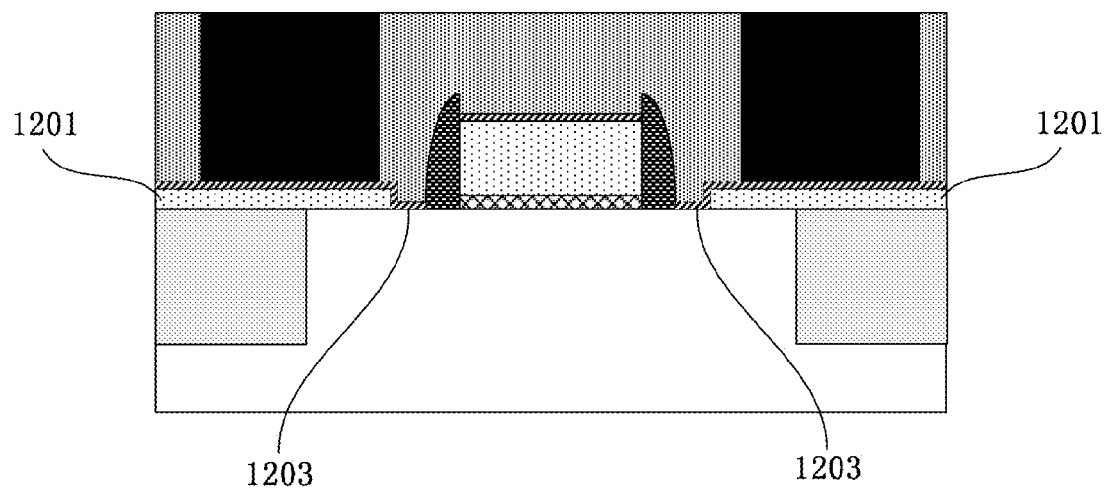

FIG. 12 is a cross-section view of a semiconductor device according to a further embodiment of the inventive concept. As shown in FIG. 12, local interconnection layers 1201 may be separated from spacers (e.g., spacers 315) formed on side surfaces of a gate (e.g., gate 311) by a predetermined distance. In contrast, the semiconductor device embodiments of FIGS. 10 and 11 show the respective local interconnection layers 801 and 1101 formed in contact with side surfaces of the spacers 315.

As previously described, the distances X1' and X2' in a semiconductor device according to embodiments of the inventive concept may be less than the respective distances X1 and X2 in a conventional semiconductor device in the prior art.

As shown in FIG. 1, the conventional semiconductor device in the prior art may require contacts (e.g., contacts 117) to be located completely on (or over) portions of the active region 103. The distances X1 and X2 may be influenced in part by the size and location of the contacts, which in turn may be determined by process and design rule limitations. For example, the process and design rule limitations may relate to the dimensions of the contacts and/or minimum "coverage" of the contacts as defined by contact-to-active region design rules.

In contrast, the embodiments of the inventive concept in the present disclosure may be free from certain constraints as imposed by the process and design rule limitations in the prior art. As shown in FIGS. 10, 11, and 12, the contacts (e.g., contacts 117) can connect to the active region (e.g., active region 103) via the respective local interconnection layers 801/1101/1201 in each embodiment. As a result, the contacts according to the embodiments of the inventive concept need not be located completely on (or over) portions of the active region, unlike the conventional semiconductor device. For example, the contacts according to the embodiments of the inventive concept may be located above portions of the active region (e.g., active region 103) and groove isolation regions (e.g., groove isolation regions 105/107).

As a result, the distances X1' and X2' in a semiconductor device according to embodiments of the inventive concept (e.g., as shown in FIG. 10) can be less than the corresponding distances X1 and X2 in a conventional semiconductor device in the prior art (e.g., as shown in FIG. 1). Thus, the size of a semiconductor device according to embodiments of the inventive concept can be further reduced (miniaturized) compared to a conventional semiconductor device.

A semiconductor device and method of manufacturing the semiconductor device according to different embodiments of the inventive concept have been described. In order to avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and do not limit the scope of the inventive concept. Furthermore, those skilled in the art would appreciate that various modifications can be made to the different embodiments without departing from the scope of the inventive concept.

What is claimed is:

1. A method of manufacturing a semiconductor device, comprising:
    forming, on a substrate, an active region and at least one groove isolation region adjoining the active region;
    forming a gate structure on a first portion of the active region;
    forming at least one local interconnection layer on a portion of the substrate, wherein the at least one local interconnection layer is formed of one single material and is directly contacting a second portion of the active region and a portion of the groove isolation region adjoining the active region, and does not extending over the gate structure,
    wherein the local interconnection layer has a first portion directly contacting the second portion of the active region and a second portion extending from the first portion along a side wall of the gate structure, height of the second portion being higher than a top surface of the first portion and lower than a top surface of the gate structure, and
    wherein forming the at least one local interconnection layer on the portion of the substrate comprises:
        forming a local interconnection material layer conformally over the groove isolation region, the active region, and the gate structure;
        forming a patterned hard mask on the local interconnection material layer, the patterned hard mask covering second portions of the active regions disposed on both sides of the gate structure and opening a top of the gate structure; and
        etching the local interconnection material layer using the patterned hard mask as an etch mask, so as to form the local interconnection layer.

2. The method according to claim 1, wherein forming the gate structure on the first portion of the active region comprises:
    forming a gate insulation layer on the first portion of the active region;
    forming a gate on the gate insulation layer;
    forming a hard mask layer on the top surface of the gate; and
    forming a spacer on at least side surfaces of the gate and the hard mask layer.

3. The method according to claim 2, wherein a portion of the at least one local interconnection layer is formed on a surface of the spacer.

4. The method according to claim 1, wherein the at least one local interconnection layer comprises polysilicon or metal.

5. The method according to claim 1, wherein the at least one local interconnection layer has a thickness ranging from about 10 Å to about 50 Å.

6. The method according to claim 1, wherein the method further comprises:
    forming a contact on a portion of the at least one local interconnection layer.

7. The method according to claim 1, wherein the at least one local interconnection layer comprises polysilicon, and the method further comprises:
    forming a silicide layer on at least a portion of the at least one local interconnection layer; and
    forming a contact on a portion of the silicide layer.

8. A semiconductor device, comprising:
    a substrate including an active region and at least one groove isolation region formed on the substrate, wherein the at least one groove isolation region is formed adjoining the active region;
    a gate structure formed on a first portion of the active region, the gate structure including a gate insulation layer formed on the first portion of the active region, a gate formed on the gate insulation layer, and a spacer formed on at least a side surface of the gate; and
    at least one local interconnection layer formed on a portion of the substrate, the at least one local interconnection layer being formed of one single material and directly contacting a second portion of the active region and a portion of the groove isolation region adjoining the active region,
    wherein the at least one local interconnection layer is located on a side of the gate structure, and covers at least the second portion of the active region and the portion of the groove isolation region adjoining the active region, wherein the at least one local interconnection layer includes a first portion disposed on the spacer and a second portion disposed on the second portion of the active region, the first portion extending from the second portion along the spacer and the first portion having height higher than a top surface of the second portion and lower than a top surface of the gate, wherein the at least one local interconnection layer does not extend over the gate structure, and wherein the at least one local interconnection layer has a thickness ranging from about 10 Å to about 50 Å.

9. The semiconductor device according to claim 8, wherein the gate structure further comprises:

a hard mask layer formed on a top surface of the gate.

10. The semiconductor device according to claim 8, wherein the at least one local interconnection layer comprises polysilicon or metal.

11. The semiconductor device according to claim 8, wherein a portion of the at least one local interconnection layer is formed on a surface of the spacer.

12. The semiconductor device according to claim 8, wherein the semiconductor device further comprises:

a contact formed on a portion of the at least one local interconnection layer.

13. The semiconductor device according to claim 8, wherein the at least one local interconnection layer comprises polysilicon, and the semiconductor device further comprises:

a silicide layer formed on at least a portion of the at least one local interconnection layer; and a contact formed on a portion of the silicide layer.

* * * * *